(12) United States Patent
Wong-Lam et al.

(10) Patent No.: US 6,418,386 B1
(45) Date of Patent: Jul. 9, 2002

(54) HIGH AND LOW VOLTAGE MEASUREMENT IN WAVEFORM ANALYSIS

(75) Inventors: Ho Wai Wong-Lam, Los Altos; Mark Douglas Naley, Santa Clara, both of CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/455,127

(22) Filed: Dec. 6, 1999

(51) Int. Cl.[7] .............................................. G01R 13/00
(52) U.S. Cl. .......................................... 702/66; 702/67
(58) Field of Search .............................. 702/57, 66, 67, 702/70, 71, 73, 180; 324/76.12, 76.13

(56) References Cited

U.S. PATENT DOCUMENTS

| | | | |
|---|---|---|---|
| 4,774,681 A | * 9/1988 | Frisch | 702/180 |
| 4,890,237 A | * 12/1989 | Bales et al. | 702/67 |
| 5,495,168 A | * 2/1996 | De Vries | 702/66 |
| 5,793,642 A | * 8/1998 | Frisch et al. | 703/4 |
| 5,943,634 A | * 8/1999 | Piety et al. | 702/56 |

FOREIGN PATENT DOCUMENTS

EP      0518116 A 1      5/1992      .......... G01R/19/25

* cited by examiner

Primary Examiner—Bryan Bui
(74) Attorney, Agent, or Firm—John Vodopia

(57) ABSTRACT

The present invention is directed to systems and methods for analyzing high and low values in a period waveform in a manner that is applicable and accurate for both pulse-shaped waveforms and non-pulse-shaped waveforms. In an example implementation, a processor is adapted to generate a waveform histogram of the signal with weighted data samples, and to determine from the waveform histogram the high and low values in the waveform. Other aspects of the invention involve various manners in obtaining the weighted data samples.

25 Claims, 8 Drawing Sheets

HIGH AND LOW VOLTAGE MEASUREMENT IN WAVEFORM ANALYSIS

RELATED PATENT DOCUMENT

This application is related to our co-pending patent application entitled "Periodic-Signal Analysis Via Correlation," U.S. patent application Ser. No. 09/455,126, the disclosure of which is incorporated herein by reference in its entirety.

FIELD OF THE INVENTION

The present invention relates generally to analysis of periodic signals and, more particularly, to a robust and accurate technique for measuring waveforms of periodic signals, for example, in connection with testing and evaluating electronic circuits.

BACKGROUND OF THE INVENTION

Measuring periodic signals is an important part of a variety of technical fields including, for example, test instruments such as oscilloscopes and programmable test fixtures. In these technical fields, measuring periodic signals typically includes automatically determining various parameters of the received signal. Among others, these parameters include voltage measurements (e.g., high and low values, amplitude, minimum and maximum values, overshoot values), time measurements (e.g., period, pulse widths), and transient measurements (e.g., rise-times and fall-times).

Various parameters of a periodic waveform are defined in terms of high and low values (or magnitudes) of a power-related parameter, such as voltage or current. Oscilloscopes and computer-based signal-measurement systems typically analyze and characterize the rise and fall times of a periodic waveform in terms of high and low voltage values. The high-low values (H and L) are also useful in performing pulse width and duty cycle measurements. For realistic signals with finite transition slopes, pulse widths and duty cycles are typically only meaningful when considered relative to a reference level. Often, H and L are treated as the 100% and 0% levels, respectively, and the 50% level is often used to generate a reference level for time measurements. The high and low value measurements, therefore, are considered significant in defining the voltage measurements of the waveform. For pulse-shaped waveforms, the high and low values (a.k a., the "top" and "base" values) correspond to the values at the 'plateau' regions, or the steady-state values before the next transition.

There are two commonly used methods for defining the voltage measurements of periodic waveforms, and they are respectively used for pulse-shaped waveforms and non-pulse-shaped waveforms. The method used for pulse-shaped waveforms is called the histogram method. The histogram method attempts to discern the ringing and spikes by creating the amplitude histogram of the waveform and search for dominant magnitude populations. The min-max method, used for non-pulse-shaped waveforms, involves finding the minimum and maximum values of the waveform to determine L and H, respectively. The min-max method is suitable for many types of signals but when used for pulse-shaped waveforms, the method is sensitive to waveform ringing and spikes; consequently, the method falls short of accurately measuring parameters such as rise times, fall times and overshoots. In practice, many applications have need to characterize both pulse-shaped waveforms and non-pulse-shaped waveforms, and the user often has to switch manually between these two high-low value defining methods to obtain meaningful results.

For pulse-shaped waveforms, the high and low values form the cornerstone in voltage measurements, because they are used in the definition of many other parameters. For example, positive overshoot corresponds as follows $$O_+ = (Max-H)/(H-L) \times 100\%.$$

In rise time and fall time ($t_r$ and $t_f$) measurements, H and L are treated as 100% and 0% level respectively. The 10%-to-90% $t_r$ is defined as the time for the waveform to traverse from the 10% to the 90% level. The results of the high and low voltage measurement are therefore not only important in their own rights, but provide a reference for time and transient measurement results as well.

Conventional algorithms, which are often based on IEC standards, are relatively simple and require relatively moderate processing power or memory. Some oscilloscopes allow the choice of either the min-max method or the histogram method in determining H and L, while others uses only the histogram method.

The histogram method attempts to determine H and L, while ignoring ringing and spikes. Precise implementations of this method vary, but a common aspect of the method involves the creation of an amplitude histogram of the waveform and search for dominant magnitude populations. According to one approach, a histogram is made with one bin for each digitizing level. The histogram is split into two sections at the halfway point between the minimum and maximum (also called the mid-point $P_M$). The level with the most points in the upper histogram is the high value and the level with most points in the lower histogram is the low value. If $P_M$ gives the largest peak value within the upper or lower histogram, $P_M$ is returned as H or L accordingly. If two or more histogram bins have the same maximum values, the bin that is farthest from M is chosen. It has been reported that this algorithm may not work well for two-level waveforms with greater than about 100% overshoot.

FIG. 2 shows the histogram obtained for an example waveform $s_n$ in FIG. 1, where n is the sample number. The x-values for the two dominant peak clusters in the histogram determine the low and high values. FIG. 3 illustrates an expanded view of the region of FIG. 2 that corresponds to the peak cluster for the high value. Two peaks are roughly equal in magnitude, namely at 19.5 mV and 22 mV. These peaks correspond to the two flat regions in the waveform. The desired high value should be just before the next transition takes place, i.e., at 22 mV. This method used in determining the next transition could have easily picked up 19.5 mV instead of 22 mV.

For further information pertaining to the above and related approaches, reference may be made to the following documents: U.S. Pat. No. : 5,495,168, entitled, "Method of Signal Analysis Employing Histograms to Establish Stable, Scaled Displays In Oscilloscopes," European Patent Document EP0518116, entitled, "Method for Measuring the Peak Value of an Alternating Voltage;" IEC 60469 Ed. 2.0b: 1987, "Pulse Techniques and Apparatus. Part 1: Pulse Terms and Definitions;" IEC 60469 Ed. 2.0b: 1987, "Pulse Techniques and Apparatus. Part 1: Pulse Measurement and Analysis;" and TDS684A, TDS744A & TDS784A, "Digitizing Oscilloscopes User Manual 070-8991-02;" and LeCroy Digital Oscilloscopes Operator's Manual, 9350/54 Series.

Accordingly, there is a need for an improved approach to high-low magnitude measurement. Such an improved approach would be advantageous if it were more robust, had improved sensitivity when compared with known histogram methods, and possessed the added advantage of automatically adapting the high-low definitions to the signal at hand, without having to explicitly specifying whether or not the waveform is pulse-shaped.

SUMMARY OF THE INVENTION

The present invention is directed to analyzing the high and low values of a periodic waveform. Various example embodiments of the present invention are directed to systems and methods involving the use of a weighted histogram for analyzing high and low values in pulse-shaped waveforms as well as non-pulse-shaped waveforms. Traditionally, the histogram method is the method of choice for analyzing high and low values in pulse-shaped waveforms, whereas another method (the min-max method) is typically used for non-pulse-shaped waveforms. The present invention is advantageous in providing an accurate determination of the high and low values in both pulse-shaped and non-pulse-shaped waveforms and alleviating the need for a user to switch manually between the two approaches to obtain meaningful results. The present invention is exemplified through a number of implementations and applications, some of which are summarized below.

According to one aspect of the present invention, a system for analyzing a waveform of a signal having at least one period employs a processor adapted to generate a waveform histogram of the signal with weighted data samples, and to determine from the waveform histogram the high and low values in the waveform. Another aspect of the present invention is directed to a method involving the same approach.

In more specific applications, weighting the sampled data includes weighting sampled data with a weight $W(n)$, where $W(n)$ is a function of a plurality of subweights, $W_1(n)$, $W_2(n)$ and $W_3(n)$, with n corresponding to a sample count and each of $W_1(n)$, $W_2(n)$ and $W_3(n)$, respectively, representing a different weighting amount.

In an even more specific embodiment, the above-identified subweights are assigned as follows: subweight $W_1(n)$ corresponds to an amount that increases with the distance from a sampled-data region representing an immediately adjacent high slope; subweight $W_2(n)$ corresponds to an amount that decreases with additional samples; and subweight $W_3(n)$ corresponds to an amount that increases with an increased magnitude of the sampled data relative to a waveform median value.

Using the weighted histogram approach, embodiments of the present invention are more robust and have improved sensitivity when compared with the conventional histogram method. Embodiments of the present invention have the added advantage of automatically adapting the high-low definitions to the signal at hand, without explicitly specifying whether or not the waveform is pulse-shaped.

The above summary of the present invention is not intended to describe each illustrated embodiment or every implementation of the present invention. For example, in other embodiments, various aspects of these embodiments are combined. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
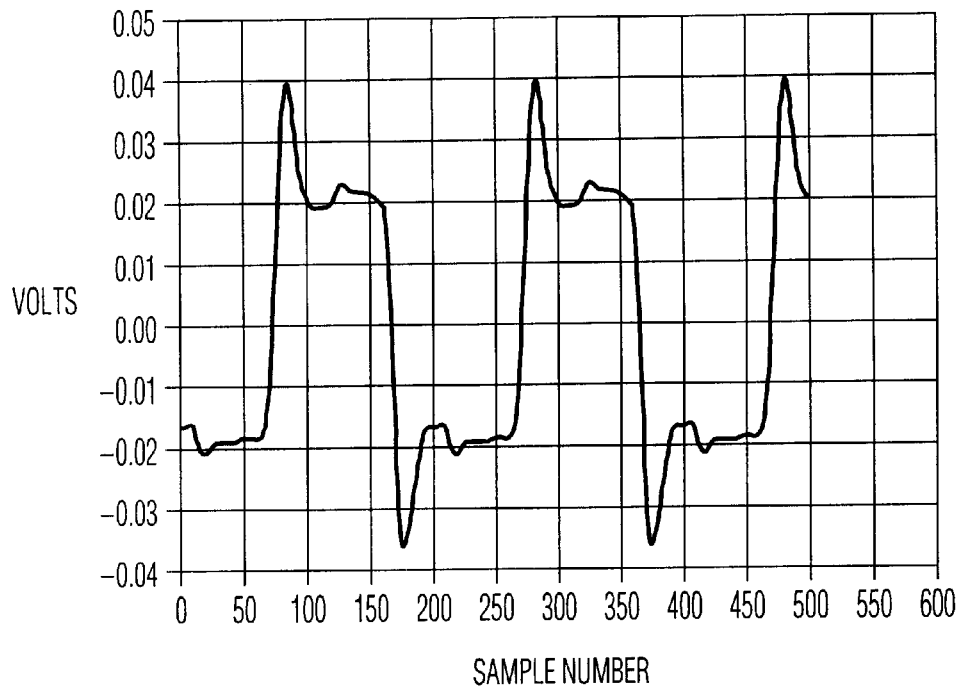
FIG. 1 is graph illustrating a conventional waveform characterized in terms of voltage at particular sample times.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of systems and instruments for analyzing periodic waveforms. Example implementations of the present invention are directed to use in test instruments, programmable CPUs, oscilloscopes, waveform simulators, and other conventional applications including those discussed in the above-cited documents (incorporated herein by reference). The invention has been found to be particularly beneficial in applications requiring accuracy in the analysis of signals and flexibility in the ability to use the same analysis approach for both pulse-shaped waveforms and non-pulse-shaped waveforms. Among many others, example applications include signal measurement and analysis in the areas of testing, circuit design, signal simulation, and general signal evaluation. An appreciation of the present invention is presented by way of various example applications, as discussed below.

In a first example implementation of the present invention, an oscilliscope is adapted to probe, analyze and characterize a periodic signal in an electric or electronic device. The oscilloscope includes a conventional signal probe adapted to sense the current and/or voltage at a node in a circuit, and a CPU arrangement programmed (or non-programmable logic circuit designed) to sample the signal presented by way of the probe and to interpret various parameters of the waveform using a processor adapted to generate a waveform histogram of the signal with weighted data samples, and to determine from the waveform histogram the high and low values in the waveform. In one example application, the processor is further adapted to use the determined high-low values to obtain the rise and fall times of the waveform and to perform pulse width and duty cycle measurements. One approach for performing such time measurements is described and illustrated in the above-referenced patent document entitled, "Periodic-Signal Analysis Via Correlation," incorporated herein by reference in its entirety.

Figure 14:
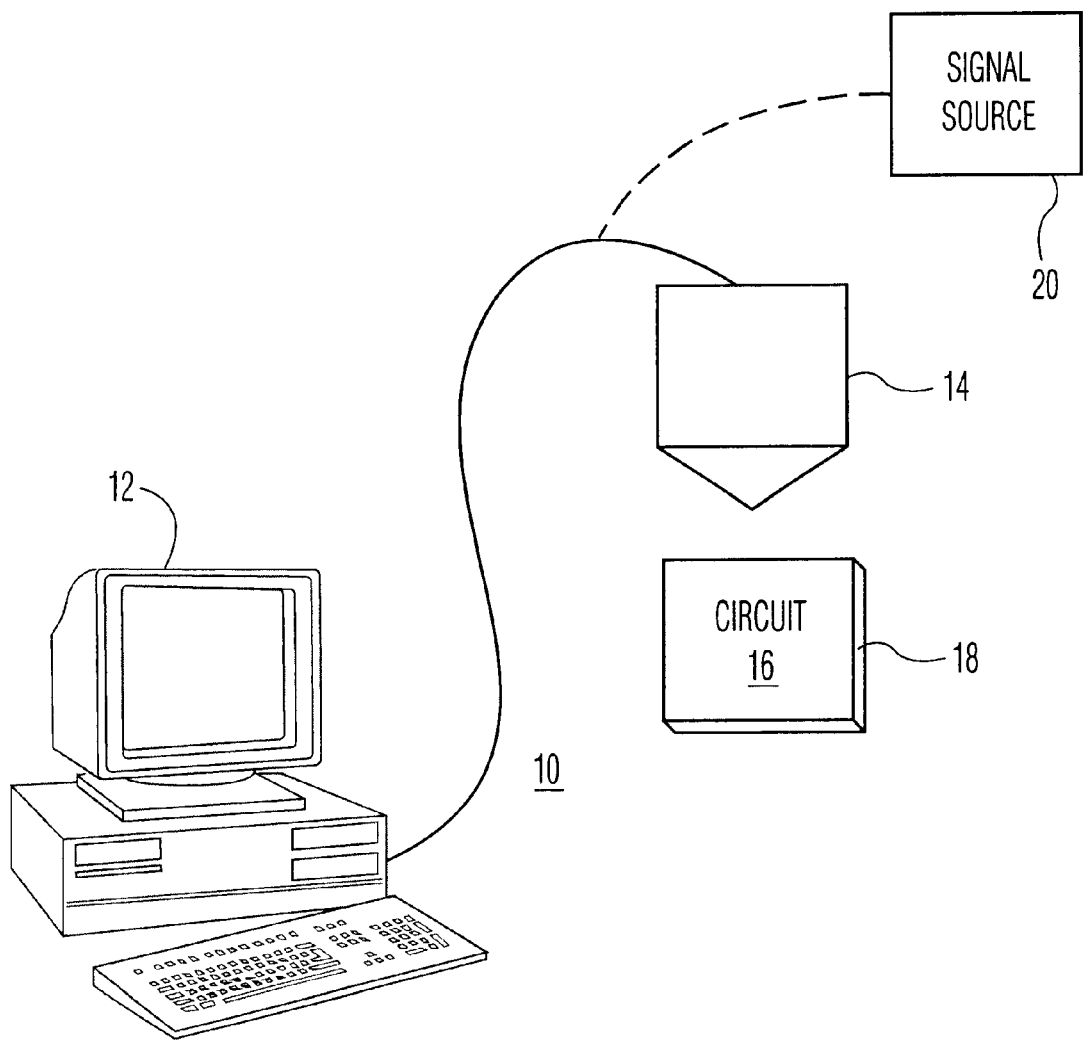
FIG. 14 is an example test system adapted according to an example embodiment of the present invention.

Another embodiment of the present invention is directed to a test system, or a signal simulator, depicted as 10 in FIG. 14. The system 10 includes a test tool 12, such as a desktop computer an oscilloscope or another test/analysis tool, having optional circuitry or a CPU arrangement adapted to use a probe 14 for sample signals at a node in an IC 16. The IC 16 may be secured in a test fixture 18 (e.g., a probe card or microscopic signal probe). The test tool 12 can access the IC through a conventional serial or parallel port and, if needed, interface circuitry such as an internal PCI digital I/O board or an external programmable logic device (PLD). In another embodiment, the waveform can be provided using pre-formed data rather than sourced in raw form by way of a node in a circuit.

Alternatively, as illustrated in FIG. 14, the signal waveform can be provided from another source 20, such as a signal generator or a data analysis package.

According to the present invention and for each of the above example embodiments, the signal waveform is accurately measured and characterized by generating a waveform histogram of the signal with weighted data samples, and by determining from the waveform histogram the high and low values in the waveform.

In connection with the present invention, certain observations have been discovered that are useful in improving the conventional histogram method, e.g., as characterized in connection with the above-reference documents. These observations are as follows: physical signals are causal and transients occur immediately after excitation, but not before; the high and low values occur at locations of the waveform that are relatively "flat;" and for non-pulse-shaped waveforms, the level(s) with the greater magnitude from the waveform median value is (are) considered more likely candidates for the high and low values.

In view of these observations and in accordance with a specific implementation of the present invention, sampled signal data is weighted using the following functional form for the weight W(n), where n is the sample number:

$$W(n)=W_1(n) \times W_2(n) \times W_3(n) \tag{1}$$

More weight is given to those amplitude values that abide by the observations (or rules) mentioned above. The weight is a function of n and includes sub-weights $W_1(n)$, $W_2(n)$ and $W_3(n)$, where: $W_1(n)$ increases as a function of n from the position where the last transition (region of relatively high slope) occurs and is reset to zero when a transition is detected; $W_2(n)$ decreases when the slope at n is large; and $W_3(n)$ increases with the waveform magnitude value from the waveform median value.

Figure 4:
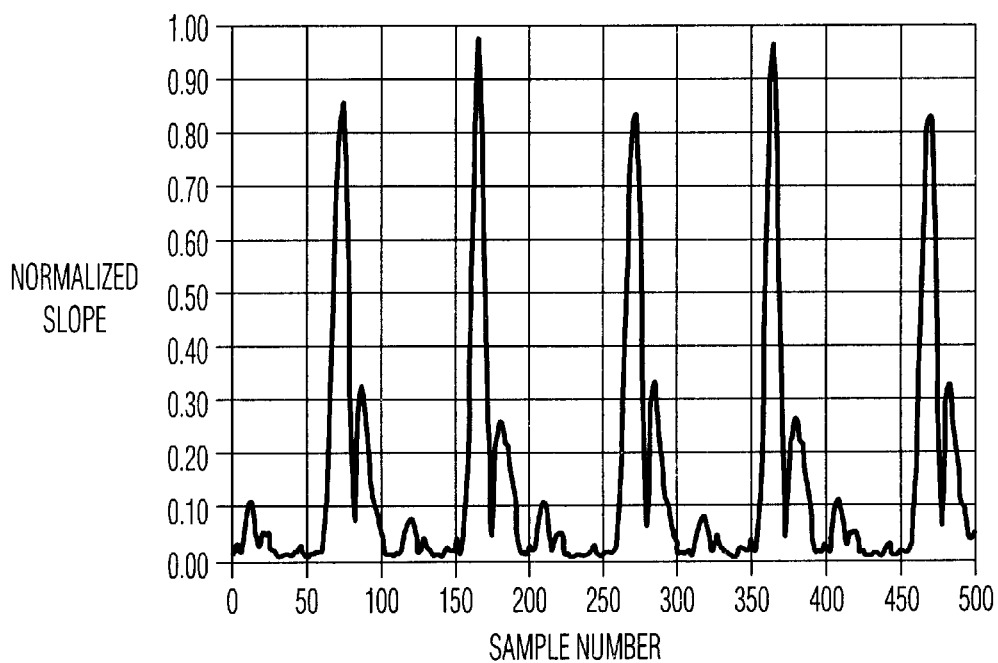
FIG. 4 is graph illustrating a normalized absolute slope $\hat{s}'_n$ of the waveform characterized in FIG. 1, according to an example embodiment of the present invention.

The subweight $W_1(n)$ is derived relative to the occurrence of a transition. Where a transition occurs, the slope tends to be large. FIG. 4 shows the normalized absolute slope $$\tilde{s}'_n = \frac{|s'_n|}{\max(|s'_n|)}$$

of the waveform in FIG. 1. A peak detector (implemented using circuitry and/or programmed devices) can be used to detect the locations L(m) (m=0, ..., M–1), where the peaks occur. Because there may be multiple peaks within each half period, it is possible that $W_1(n)$ becomes reset unnecessarily; however, such an unnecessary reset does not significantly affect the result.

Figure 5:
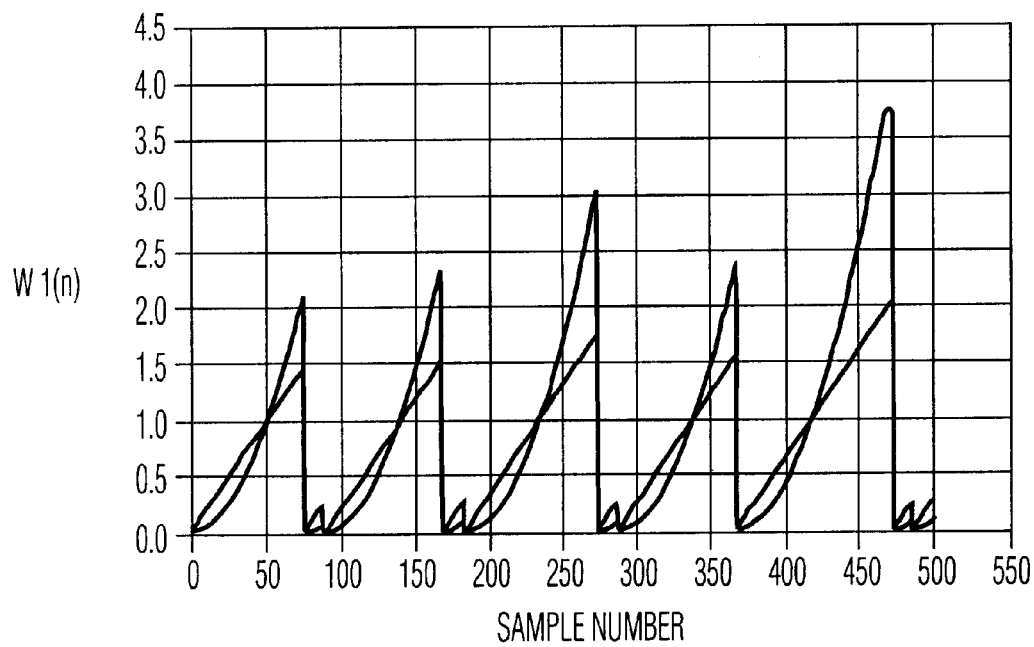
FIG. 5 is graph illustrating a subweight $W_1(n)$ that is made to vary linearly or squarely proportionally with the sample number from the last occurrence of a peak in slope, also according to an example embodiment of the present invention.

In FIG. 5, $W_1(n)$ is made to vary linearly or squarely proportionally with the time from the last occurrence of a peak in slope.

$$W_1(n) = \left(\frac{n - n_m}{L}\right)^k, \text{ where } k = 1 \text{ or } 2 \text{ etc.} \tag{2}$$

The variable $n_m$ is the sample number where the m-th peak of the slope magnitude of the waveform occurs, corresponding to the last transition location.

$$\bar{L} = \sum_{m=0}^{M-2} \frac{L(m+1) - L(m)}{M-1} = \frac{L(M-1) - L(0)}{M-1}$$

is the average distance between successive peaks.

Figure 6:
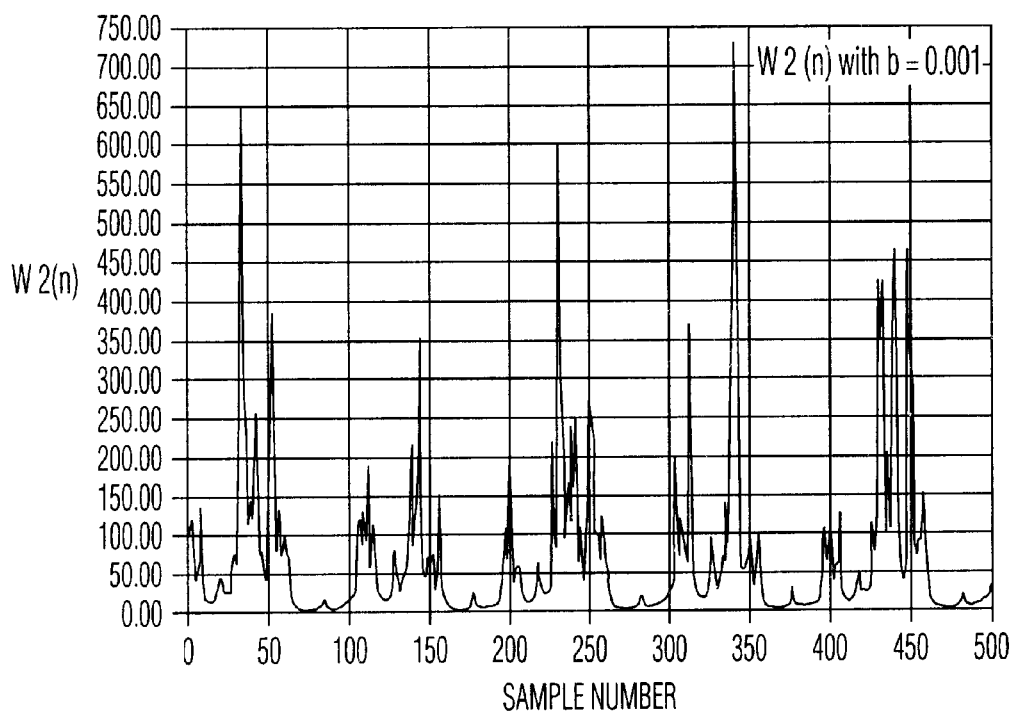
FIG. 6 is a graph illustrating a subweight $W_2(n)$ that is made to vary inversely proportionally with the normalized absolute slope at n, according to an example embodiment of the present invention.

In FIG. 6, the subweight $W_2(n)$ is made to vary inversely proportionally with the normalized absolute slope at n:

$$W_2(n) = \frac{1}{\tilde{s}'_n + b}, \tag{3}$$

where $\tilde{s}'_n$ is again the normalized absolute value of the slope and b controls the maximum attainable weight.

The subweight $W_3(n)$ can be derived as a function of the signal median, since the level with greater distance from the signal median should be given more weight. The signal normalization is done to make $W_3(n)$ insensitive with respect to signal amplitude.

$$W_3(n)=|\tilde{s}_n|, \tag{4}$$

where $$\tilde{s}_n = 2\frac{s_n - \hat{s}}{\max(s_n) - \min(s_n)}$$

and the waveform median $$\hat{s} = \frac{\max(s_n) + \min(s_n)}{2}.$$

Figure 7:
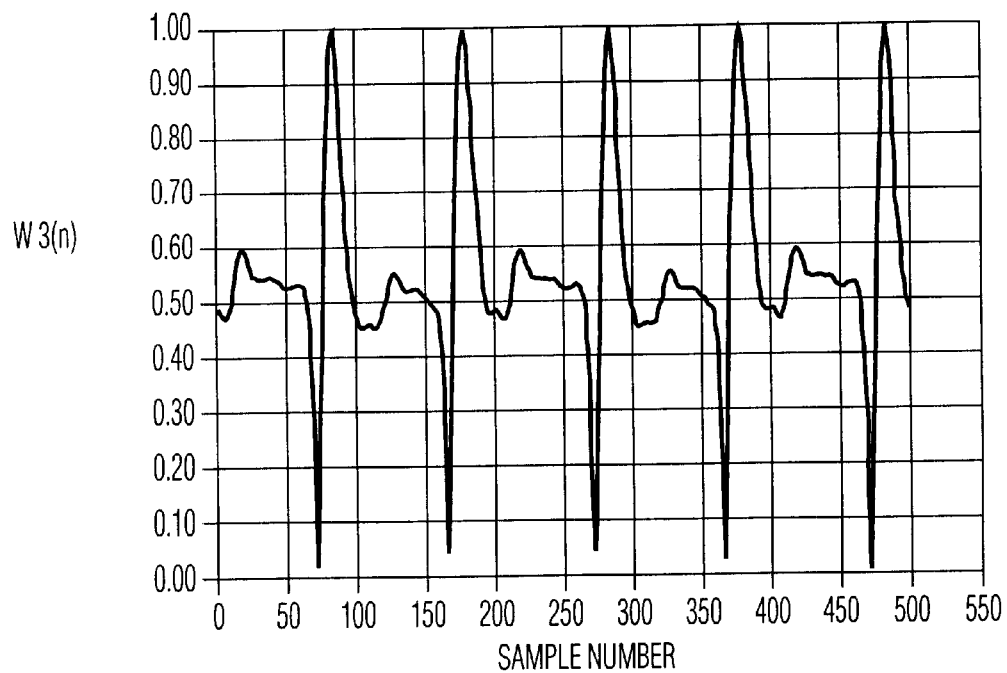
FIG. 7 is graph illustrating a subweight $W_3(n)$ that varies proportionally with the signal magnitude at n, according to an example embodiment of the present invention.

FIG. 7 shows $W_3(n)$ for the example waveform.

Figure 2:
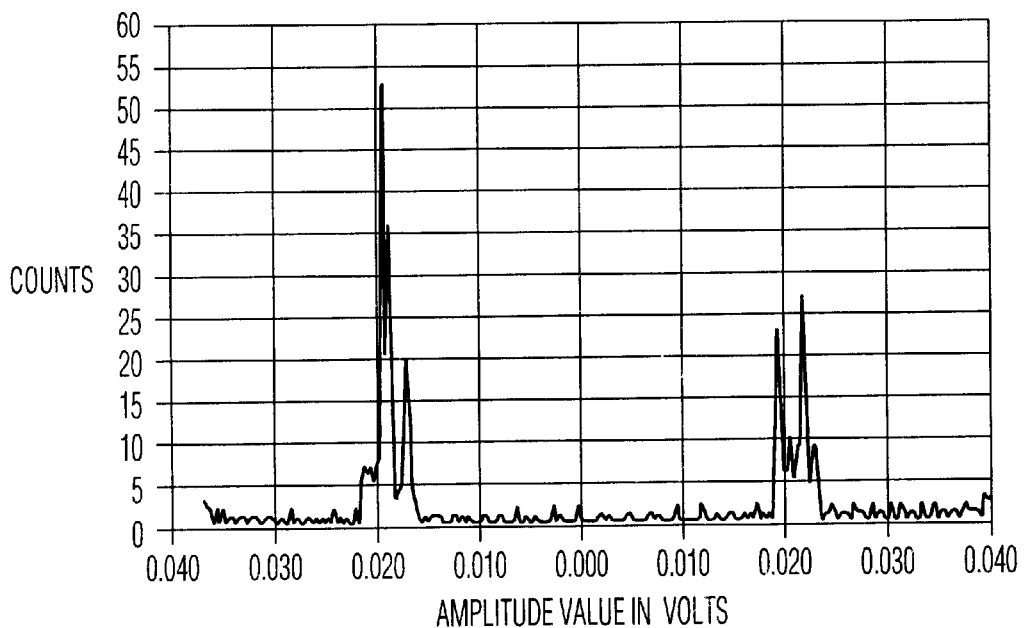
FIG. 2 is a conventional histogram for the waveform in FIG. 1, with the Y axis representing counts at a particular voltage and with the X axis carrying values for the two dominant peak clusters that determine the low and high values.
Figure 3:
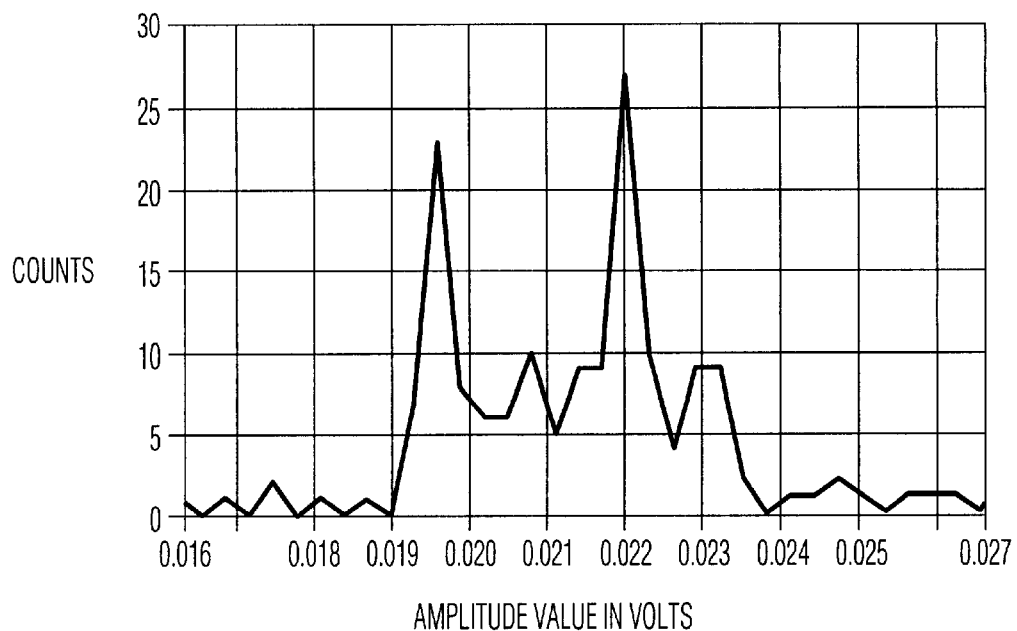
FIG. 3 is graph illustrating an expanded view of the region in the X-axis of FIG. 2 corresponding to the determination of the high value.
Figure 8:
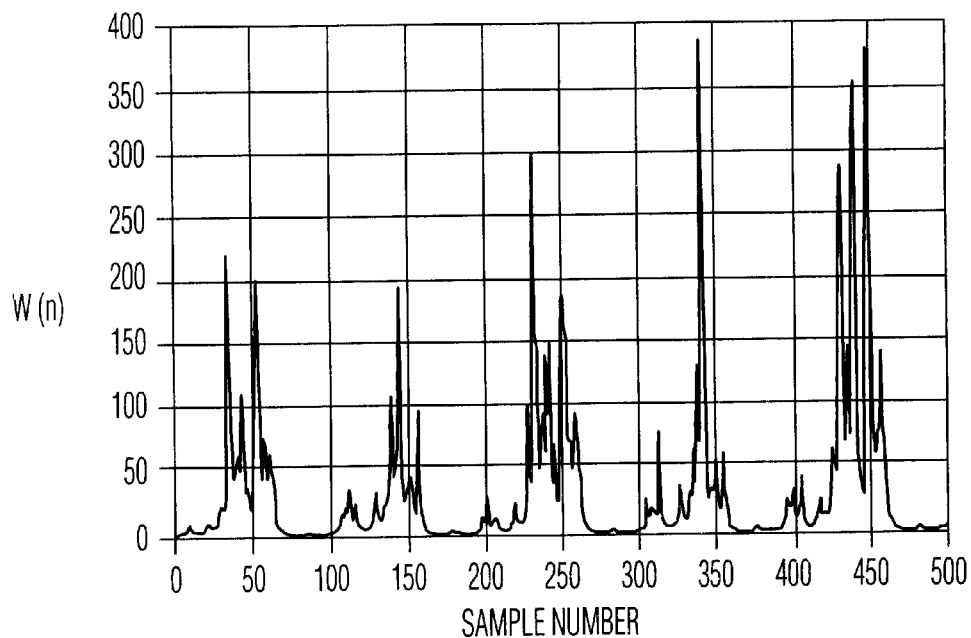
FIG. 8 is a graph illustrating a weighting function $W(n)$, based on each of the subweights depicted in connection with FIGS. 5–7.
Figure 9:
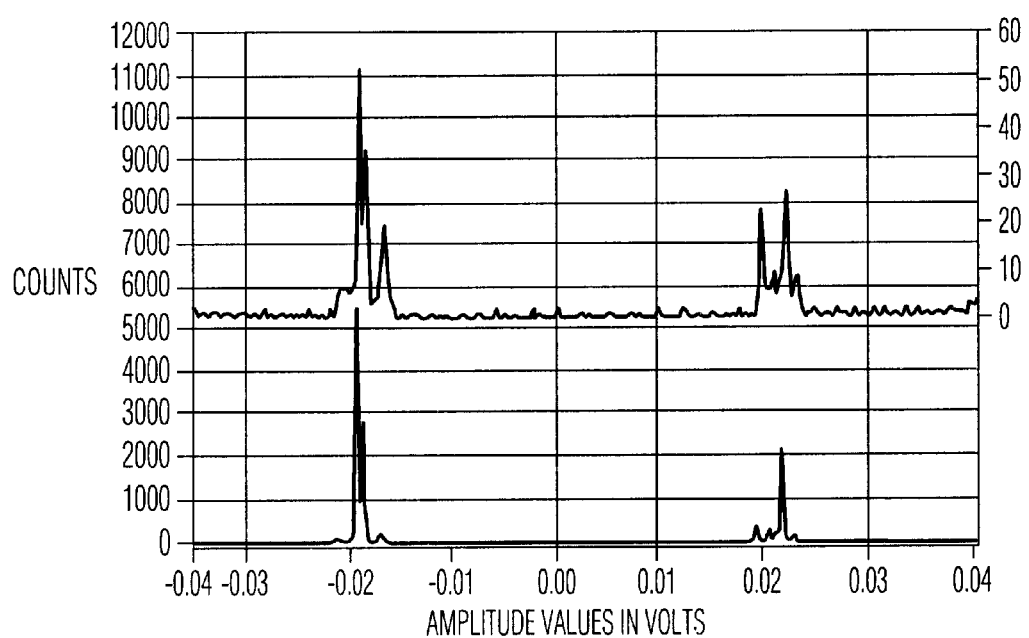
FIG. 9 is a comparison graph illustrating the weighted and unweighted histograms, respectively, according to the weighting function $W(n)$ of FIG. 8 and the unweighted histogram of FIG. 2.
Figure 10:
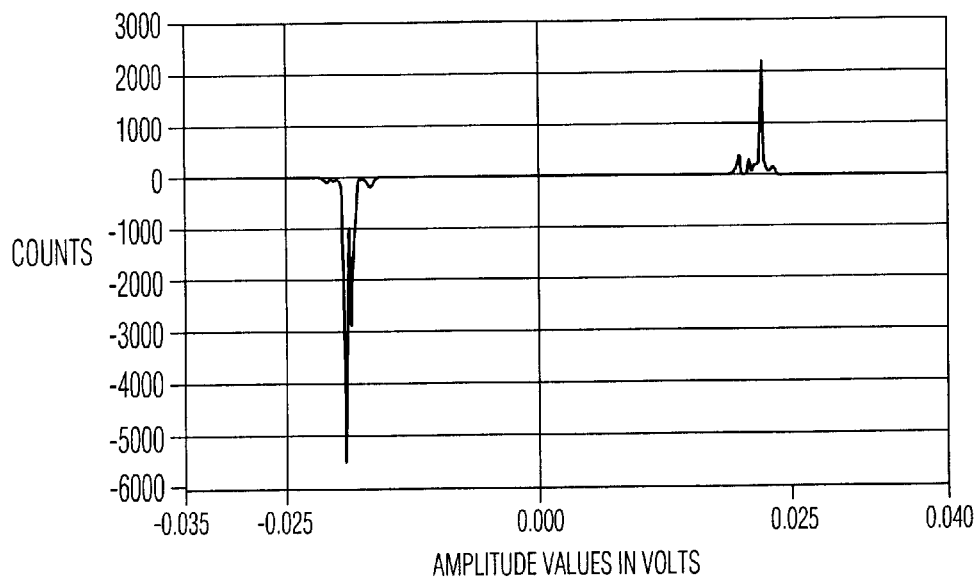
FIG. 10 is a graph illustrating a signed-weighted histogram, according to an example embodiment of the present invention.

FIG. 8 shows the weighting function $W(n)=W_1(n)\times W_2(n)\times W_3(n)$, while FIG. 9 shows the weighted histogram. Comparison of the weighted histogram with the unweighted histogram in FIG. 2 shows that the peaks are much more distinct in the weighted histogram. This weighted histogram therefore provides a measurement with higher sensitivity.

The values H and L can be readily separated using yet other findings made in connection with the present invention. It is valid to assume that H and L are on opposite sides of the median value $\hat{s}$. Straight-forward separation of the high and low values can be realized by appreciating that a normal (weighted) histogram would have two dominant positive peaks. The x-positions of these two peaks correspond to the high and low values. In this case, a slight modification to $W_3(n)$ is made. Instead of using $|\check{s}_n|$, simply $\check{s}_n$ is used. Thus, in this instance:

$$W_3(n)=\check{s}_n \quad (5)$$

The weights are automatically made negative in the lower half of the original waveform and positive in the upper half of the waveform. In this special case, H is equal to the location of maximum value in the weighted histogram, and L is equal to the location of minimum value in the weighted histogram.

Another aspect of the present invention increases computational efficiency for many, through perhaps not all, waveform types. In this application, the dominant peaks of a weighted histogram can be immediately assigned a polarity (positive or negative) when it is known beforehand that H is positive and L is negative. This can occur, for example, where signals are top-bottom symmetric.

Figure 11:
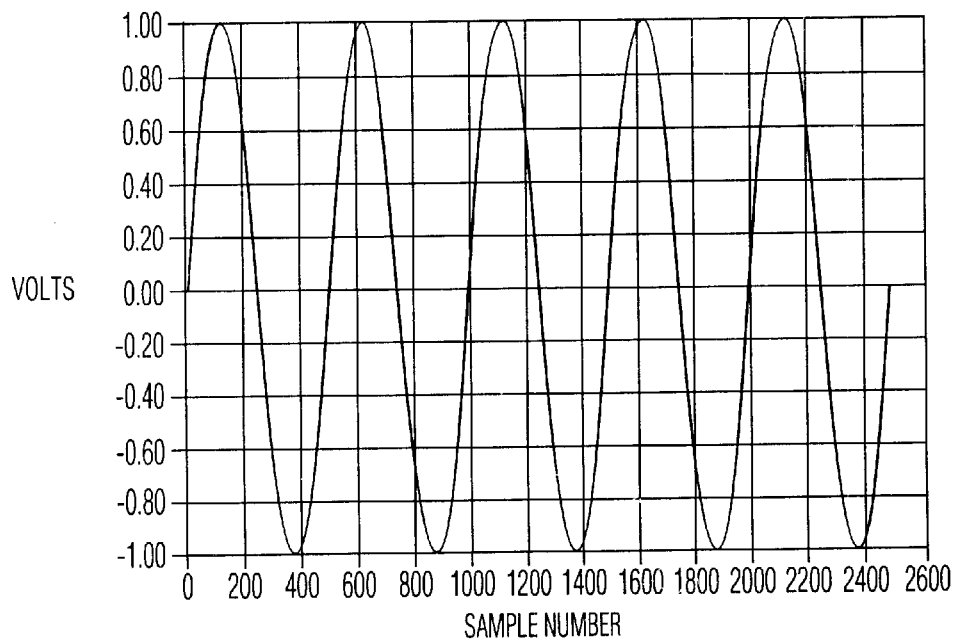
FIG. 11 is a graph illustrating a conventional sinusoidal waveform.
Figure 12:
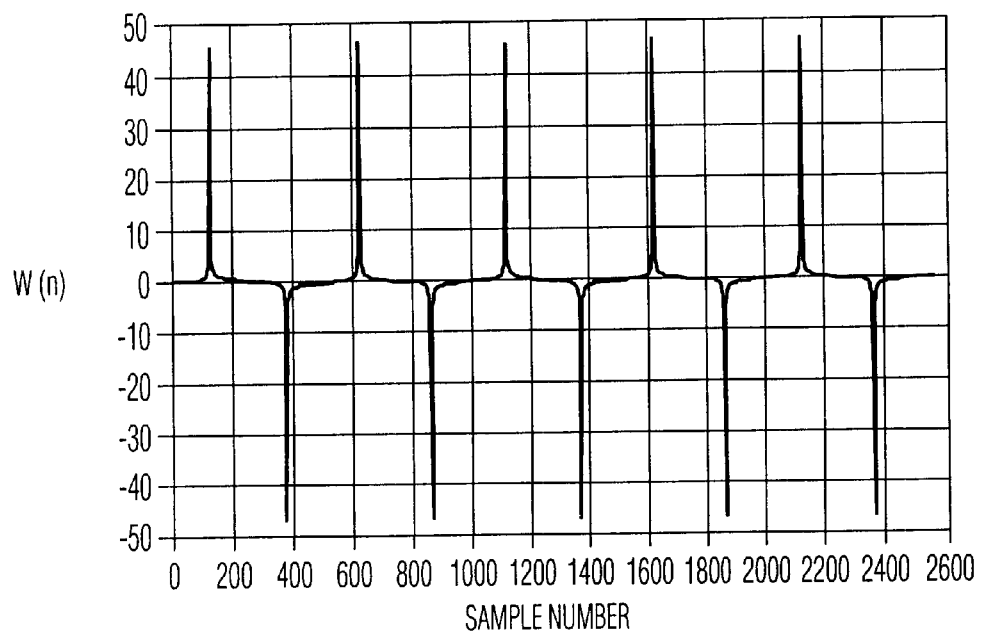
FIG. 12 is a graph illustrating a weighting function $W(n)$ for the sinusoidal waveform of FIG. 11, according to an example embodiment of the present invention.
Figure 13:
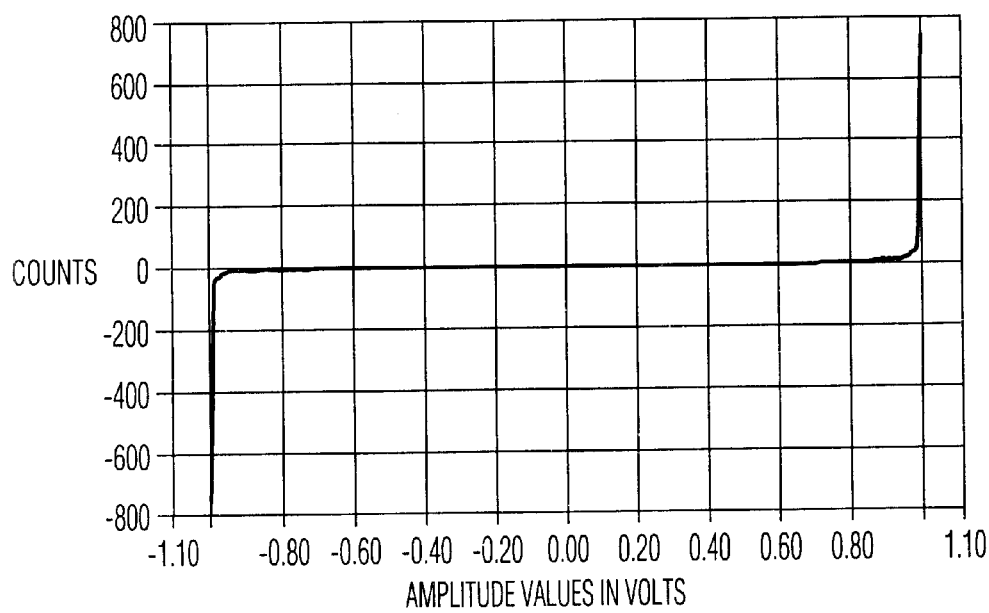
FIG. 13 is a graph illustrating a weighted histogram for the sinusoidal waveform of FIG. 11, according to an example embodiment of the present invention.

Discussion of an example non-pulse-shaped waveform illustrates this special situation. FIG. 12 shows the weighting function, W(n), for the sinusoidal waveform in FIG. 11, and FIG. 13 shows the weighted histogram in accordance with the present invention. In this example, $W_3(n)$ dominates W(n), and the algorithm automatically picks the minimum and maximum values as the low and high values respectively, without explicit specification of whether or not the waveform is pulse-shaped.

Accordingly, the present invention provides a more robust and accurate weighted-histogram approach that is more robust, and has improved sensitivity compared with the conventional histogram method. Embodiments of the present invention have the added advantage of being able to adapt the high-low definitions to the signal at hand automatically, without explicitly specifying whether a pulse-shaped waveform or a non-pulse-shaped waveform is being used. While the present invention has been described with reference to several particular example embodiments, those skilled in the art will recognize that many changes may be made thereto. For example, selected aspects of the present invention, as discussed above, can be used together or selectively to enhance approaches that would otherwise be less accurate or flexible. These and other embodiments do not necessarily depart from the spirit and scope of the present invention, which is set forth in the following claims.

What is claimed is:

1. A method for analyzing the waveform of a signal having high and low magnitudes, comprising: generating a waveform histogram of the signal at least partially from weighted data samples of the signal; and determining from the waveform histogram at least one of a high value and a low value in the waveform.

2. A method for analyzing the waveform of a signal, according to claim 1, wherein generating a waveform histogram includes weighting data corresponding to samples from the waveform.

3. A method for analyzing the waveform of a signal, according to claim 2, wherein weighting data includes weighting by an amount that increases with the distance from a sampled-data region representing an immediately adjacent transition.

4. A method for analyzing the waveform of a signal, according to claim 2, wherein weighting data includes weighting by an amount that decreases with the slope.

5. A method for analyzing the waveform of a signal, according to claim 2, wherein weighting data includes weighting by an amount that increases with an increased magnitude of the sampled data relative to a waveform median value.

6. A method for analyzing the waveform of a signal, according to claim 2, wherein weighting data includes weighting using a plurality of subweights, each subweight having a value that is defined as a function of a sampling count.

7. A method for analyzing the waveform of a signal, according to claim 6, wherein weighting using a plurality of subweights includes at least two of the following factors: subweighting by an amount that increases with the distance from a sampled-data region representing an immediately adjacent high slope; subweighting by an amount that decreases with the slope; and subweighting by an amount that increases with an increased magnitude of the sampled data relative to a waveform median value.

8. A method for analyzing the waveform of a signal, according to claim 2, wherein weighting data includes weighting sampled data with a weight W(n), where W(n) is a function of a plurality of subweights, $W_1(n)$, $W_2(n)$ and $W_3(n)$, wherein n corresponds to a sample count and each of $W_1(n)$, $W_2(n)$ and $W_3(n)$, respectively represents a different weighting amount.

9. A method for analyzing the waveform of a signal, according to claim 8, wherein: subweight $W_1(n)$ corresponds to an amount that increases with the distance from a sampled-data region representing an immediately adjacent high slope; subweight $W_2(n)$ corresponds to an amount that decreases with the slope; and subweight $W_3(n)$ corresponds to an amount that increases with an increased magnitude of the sampled data relative to a waveform median value.

10. A method for analyzing the waveform of a signal, according to claim 9, further including detecting transitions in the signal, and wherein subweight $W_1(n)$ is reset to an initial value in response to detecting a transition in the signal.

11. A method for analyzing the waveform of a signal, according to claim 9, wherein subweight $W_2(n)$ varies inversely proportionally with a normalized absolute slope magnitude at n.

12. A method for analyzing the waveform of a signal, according to claim 2, wherein weighting data includes weighting sampled data with a weight W(n), where $W(n)=W_1(n)\times W_2(n)\times W_3(n)$, wherein n corresponds to a sample count, $W_1(n)$ corresponds to an amount that increases with the distance from a sampled-data region representing an immediately adjacent high slope; $W_2(n)$ corresponds to an amount that decreases with additional samples; and $W_3(n)$ corresponds to an amount that increases with an increased magnitude of the sampled data relative to a waveform median value.

13. A method for analyzing the waveform of a signal, according to claim 2, wherein weighting data includes weighting by a value that is a function of a sample count.

14. A method for analyzing the waveform of a signal, according to claim 1, wherein generating a waveform histogram includes generating a weighting function based on the waveform, the waveform being generated by applying the weighting function to data corresponding to samples from the waveform.

15. An apparatus for analyzing the waveform of a signal having high and low magnitudes, comprising:
generating means for generating a waveform histogram of the signal at least partially from weighted data samples of the signal; and
determining means for determining from the waveform histogram at least one of a high value and a low value in the waveform.

16. An apparatus, according to claim 15, wherein at least one of said generating means and said determining means is included as part of at least one of a test instrument, a programmable CPU, an oscilloscope, and a waveform simulator.

17. An apparatus, according to claim 15, wherein said generating means generate the waveform histogram of the signal by generating a weighting function based on the waveform and applying the weighting function to data corresponding to samples from the waveform.

18. An apparatus for analyzing the waveform of a signal having high and low magnitudes, comprising:
a signal receiver adapted to receive the waveform;
a processor arrangement adapted to generate a waveform histogram of the signal at least partially from weighted data samples of the signal, and to determine from the waveform histogram at least one of a high value and a low value in the waveform.

19. An apparatus, according to claim 18, wherein the processor arrangement is further adapted to determine from the waveform histogram high and low values in the waveform.

20. An apparatus, according to claim 18, wherein the processor arrangement is further adapted to weight data using a plurality of subweights, each subweight having a value that is defined as a function of a sampling count.

21. An apparatus, according to claim 18, wherein the processor arrangement is further adapted to weight using a plurality of subweights, the subweights including the following factors: subweighting by an amount that increases with the distance from a sampled-data region representing an immediately adjacent high slope; subweighting by an amount that decreases with the slope; and subweighting by an amount that increases with an increased magnitude of the sampled data relative to a waveform median value.

22. An apparatus, according to claim 18, wherein the processor arrangement is further adapted to weight sampled data with a weight $W(n)$, where $W(n)$ is a function of a plurality of subweights, $W_1(n)$, $W_2(n)$ and $W_3(n)$, wherein n corresponds to a sample count and each of $W_1(n)$, $W_2(n)$ and $W_3(n)$, respectively represents a different weighting amount.

23. An apparatus, according to claim 22, wherein: subweight $W_1(n)$ corresponds to an amount that increases with the distance from a sampled-data region representing an immediately adjacent high slope; subweight $W_2(n)$ corresponds to an amount that decreases with additional samples; and subweight $W_3(n)$ corresponds to an amount that increases with an increased magnitude of the sampled data relative to a waveform median value.

24. An apparatus, according to claim 22, wherein subweight $W_1(n)$ is reset to an initial value in response to detecting a transition in the signal.

25. An apparatus, according to claim 18, wherein the processor arrangement generates the waveform histogram of the signal by generating a weighting function based on the waveform and applying the weighting function to data corresponding to samples from the waveform.

* * * * *